United States Patent [19]
Tanaka et al.

[11] Patent Number: 4,794,602
[45] Date of Patent: Dec. 27, 1988

[54] METHOD FOR ERROR DETECTION

[75] Inventors: Masato Tanaka, Minato; Takuji Himeno, Funabashi, both of Japan

[73] Assignee: Sony Corporation, Tokyo, Japan

[21] Appl. No.: 54,426

[22] Filed: May 26, 1987

Related U.S. Application Data

[63] Continuation of Ser. No. 706,923, Feb. 12, 1985, abandoned.

[51] Int. Cl.⁴ .............................................. G06F 11/10
[52] U.S. Cl. ......................................... 371/37; 371/38
[58] Field of Search ........................ 371/37, 38, 39, 40

[56] References Cited

U.S. PATENT DOCUMENTS

| | | | |
|---|---|---|---|
| 4,477,903 | 10/1984 | Schouhamer Immink | 371/38 X |
| 4,562,578 | 12/1985 | Odaka | 371/39 X |
| 4,593,394 | 6/1986 | Tomimitsu | 371/38 X |
| 4,604,747 | 8/1986 | Onishi | 371/38 X |
| 4,649,542 | 3/1987 | Nishimura | 371/38 X |
| 4,677,622 | 6/1987 | Okamoto | 371/39 |
| 4,719,628 | 1/1988 | Ozaki | 371/37 X |
| 4,726,028 | 2/1988 | Himeno | 371/37 |
| 4,750,178 | 6/1988 | Sako | 371/37 |

Primary Examiner—Jerry Smith
Assistant Examiner—Robert W. Beausoliel
Attorney, Agent, or Firm—Hill, Van Santen, Steadman & Simpson

[57] ABSTRACT

This invention provides an error detecting method, wherein upon decoding a data signal which is formed by such a manner that a data word D is formed of a predetermined number of bits of digital signals, a data block is formed of a predetermined number of the data words D which are successive on a recording or transmission medium, one error check code CRC is provided for a sequence within the data block and another error check code for another series which is different from said series within said data block is provided for a sequence of said data blocks all of erroneous data words detected by another error check code P are regarded as being erroneous. By this method, the erroneous data word can be positively detected.

10 Claims, 4 Drawing Sheets

| | | $F_3.F_4$ | | | |
|---|---|---|---|---|---|
| | | 0.0 | 0.1 | 1.0 | 1.1 |
| $F_1.F_2$ | 0.0 | (4) | (5) | (0)(6) | (C) |
| | 0.1 | (5) | | (3) | (C) |
| | 1.0 | (0)(6) | (2) | (1) | (C) |
| | 1.1 | (C) | (C) | (C) | (C) |

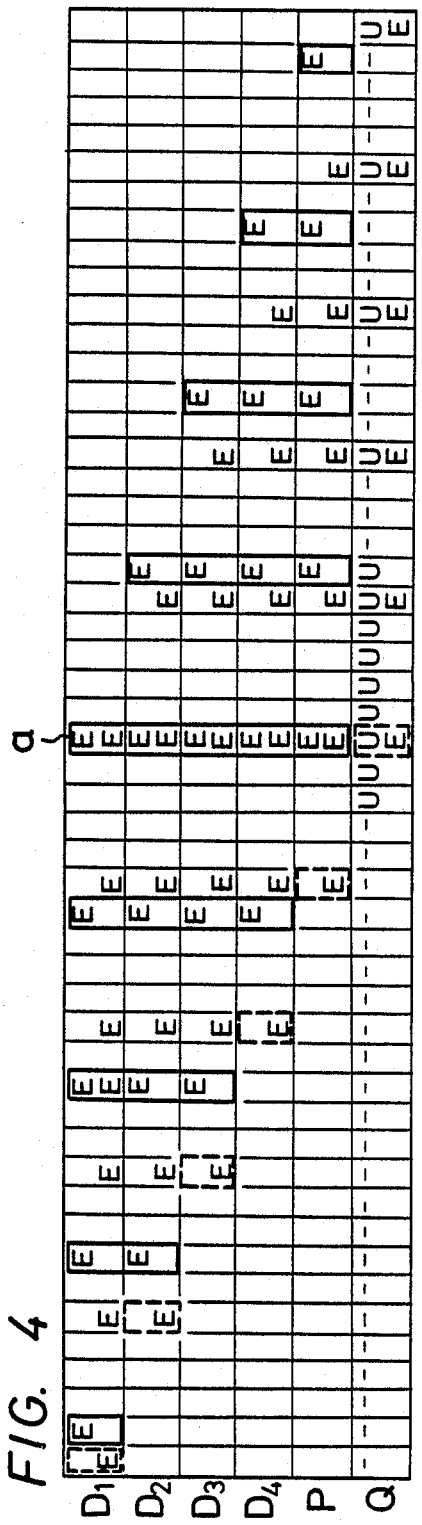

METHOD FOR ERROR DETECTION

This is a continuation of application Ser. No. 706,923, filed 2/12/85 now abandoned.

DESCRIPTION

1. Technical Field

This invention relates to a method for error detection for use with a so-called digital recording and reproducing apparatus.

2. Background Art

In the prior art, it is proposed that an audio signal, for example, is A/D-converted to a digital signal, then recorded and reproduced. In that case, an error correction is carried out by a so-called cross-interleaving. More particularly, a data word is formed by a predetermined number of bits of the digital signal, and a predetermined number of the succeeding data word is used to form a data block, in which a CRC check code, for example, produced from a series therein is provided, and parity check code, for example, is provided from a series different from that provided within the aforesaid data block for the sequence of data blocks.

As, for example, shown in FIG. 1, a data signal to be recorded and reproduced (or transmitted) is formed of one data block that consists of sequentially a synchronizing signal S, an address signal A, data words D1, D2, D3 and D4 of 16 bits each, parity check codes P, Q of 16 bits each and a CRC check code C. This data block is transmitted sequentially. In this case, the CRC check code C is formed for the data words D1 to D4 and the parity check codes P and Q in the same data block. The parity check codes P and Q are formed for series as, for example, shown by a solid line and a broken line when the data blocks are arranged sequentially as shown in FIG. 2. In this case, since the parity check code Q is formed for the data including the code P, after the parity check code P is formed, the parity check code Q is formed and then the CRC check code C is formed.

With this arrangement, upon reproducing (or demodulating), in the series of an arbitrary check code P or Q, when an error which is detected by the CRC check code in the data word contained in that series is only one word, the error can be corrected by the parity check code P or Q. Further, if the error correction in the two series are alternately repeated, the error correction ability can be enhanced.

However, in such apparatus, when a recording medium that was used once is, for example, used again to carry out the recording thereon, the previously recorded data will frequently be reproduced due to the fact that the data is left unerased. In that case, since the data signal left unerased is correct when seen only from the unerased portion, no error is detected by the CRC check code.

Further, depending on the content of error, the detection of the error by the CRC check code will occasionally become impossible in a probability standpoint.

As a result, when such erroneous data signal is unintentionally reproduced, such data signal causes an abnormal sound in the reproduced signal and thereby a tone quality is deteriorated considerably.

Alternatively, when in the series of the above parity check code P or Q, both the erroneous data word that is detected by the CRC check code and the erroneous data word that can not be detected exist simultaneously, the erroneous or mis-correction is carried out for the detected erroneous data word. This erroneous correction affects the succeeding series and hence there is a fear that the erroneous correction will be propagated.

SUMMARY OF THE INVENTION

In view of such aspect, this invention is to provide a method for error detection capable of detecting an erroneous data word positively.

BRIEF DESCRIPTION OF DRAWINGS

FIG. 4 illustrates a memory map with an example having a number of detected errors;

FIG. 5 illustrates the format of a stored data word incorporating 16 bits and 4 flags;

FIG. 6 is a chart illustrating the 16 possible combinations of the 4 flags of FIG. 5, and the separate treatment of each different combination of the flags;

FIG. 7 illustrates a memory map of the example of FIG. 4, with the reduction of a number of corrected words which are judged as being erroneous;

FIG. 8 illustrates a memory map of the example of FIG. 4, in which data words judged as being erroneous are identified in a different way;

FIG. 9 illustrates an example in which no error is detected by the CRC check, and two successive data blocks are erroneous; and FIG. 10 illustrates an example in which an erroneous data block is detected by the CRC check code in the vicinity of another erroneous data block.

BEST MODE FOR CARRYING OUT THE INVENTION

Figure 1:
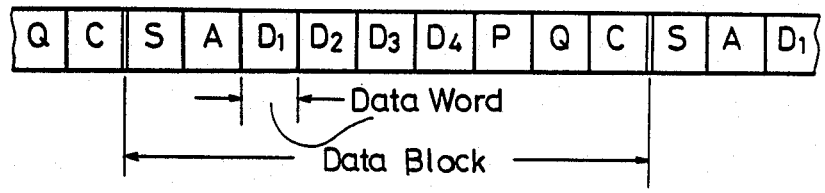
FIGS. 1 and 2 are diagrams useful for explaining prior are error detection and error correction.
Figure 2:
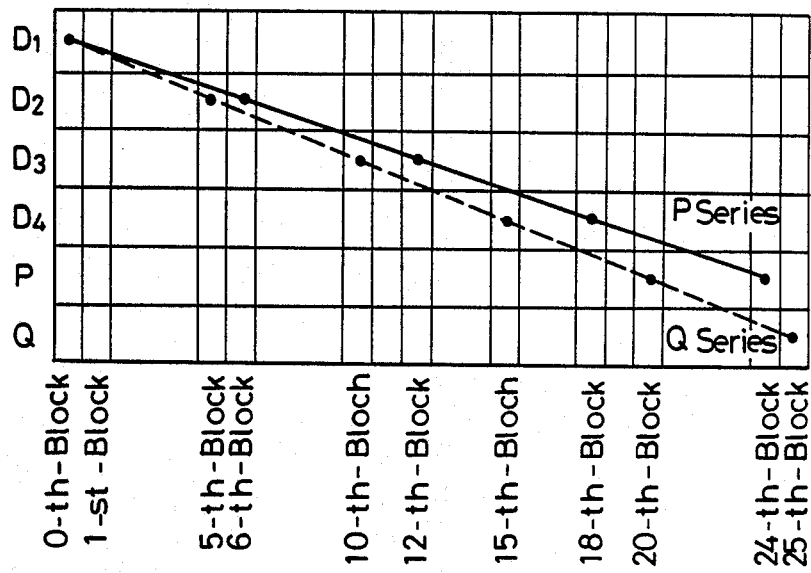
Figure 3:
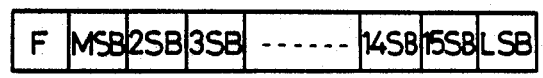
FIG. 3 illustrates the format of a data word stored in random access memory.

In FIG. 3, area of a flag F (one bit) for an error point is provided together with a data area of 16 bits in each word area of a random access memory, in which data words are written in. In this case, the overall arrangement of the random access memory is such as shown in FIG. 2, and word areas also extended in the right-hand and left-hand side directions thereof are added with the addresses of the number corresponding to the data block that concerns one error correction.

Firstly, all the flags F are set to "1" for such random access memory.

Then, the data signals D1 to D4, and the parity check codes P and Q of the data block that is judged as having no error by the CRC check code C are written in the random access memory at the addresses corresponding to the address signal A and the flag F of each written word is changed to "0".

Further, a parity check is carried out in the series of the parity check code P. At this time, if it is judged that there is no data word with the flag "1" and the data word is judged erroneous, by the parity check the flags F of all the data words contained in this series are set to "1". This will be carried out on all the data blocks.

Furthermore, another parity check is carried out in the series of the parity check code Q. When it is judged that there is no data word with the flag F "1" and the data word is judged erroneous by another parity check, the flags F of all the data words that are contained in such series are set to "1". If, for the other cases than mentioned above, if there is only one data word with the flag F "1", the error correction is carried out. This will be carried out for all the data blocks.

Similarly to the prior art, the error corrections in the series of the parity check codes P and Q are hereinafter alternately carried out so as to enhance the error correction ability.

As described above, the error detection and the error correction are carried out. According to this method, it is possible to prevent the error from being caused by overlooking the above CRC check code. Moreover, there is no fear that the influence of the erroneous correction is spread.

That is, when, in FIG. 4, only the central data block a is erroneous because of the data left unerased and this error is not detected by the CRC check code C, if the parity check is carried out in the series of the parity check code P, the data words encircled by the solid lines are judged as being erroneous and the flags F thereof are set to "1". Then, the parity check is carried out in the series of the parity check code Q. At this time, since the flags of the data words D1 to D4 and the parity check code P within the data block a were already set to "1", the series including this data word is not checked but data words containing the data word Q and encircled by broken lines are judged as being erroneous and the flags F thereof are set to "1". Thereafter, the error correction is carried out by using these flags. In the figure, reference letters E designate data words which are contained in the data blocks having errors, while data words E that are not encircled by the lines are words judged as being erroneous when the check by the series of the parity check code Q is previously made.

However, in the above method, when the series is judged as being erroneous by the parity check, although only one data word is erroneous in the series, all the data words in that series are judged as being erroneous so that the correct data word is also judged as being erroneous and thus the number of the erroneous data words is increased considerably. In this case, since the series of the parity check code P is particularly identical with the input/output series of AD/DA before being cross-interleaved frequently, this series directly affects the tone quality. Thus, if in this series there exist many erroneous data words, the tone quality is extremely deteriorated.

When all the data words in the series of the parity check code P or Q are regarded as being erroneous, it becomes very difficult to completely correct the erroneous data words by using the other series. And, there is a fear that the interpolation and the like are employed and hence the tone quality will be deteriorated.

Therefore, as shown in FIG. 5, together with the data area of 16 bits, area of flags F1, F2, F3 and F4 of 4 bits for error pointer are provided in each word area of the random access memory in which it is written. In this case, the flags F1 and F2 are used as for the series of the parity check code P and the flags F3 and F4 are used as for the series of the parity check code Q. And, the flags (0, 0) are formed for the data which is judged as being free of error by the respective parity checks, the flags (0, 1) are formed for the data whose parity check is impossible, since there are more than or equal to one erroneous data word by the CRC check, the flags (1, 0) are formed for the data which is judged as being erroneous by the parity check and the flags (1, 1) are formed for the data which is judged as being erroneous by the CRC check code.

In accordance with this arrangement, all the data blocks are judged by the series of the parity check codes P and Q.

That is, the flags F1 to F4 in the random access memory are all set to "1".

Then, the data signals D1 to D4 and the parity check codes P and Q of the data block which is judged as having no error by the CRC check code C are written in random access memory at the addresses corresponding to the address signal A and the flags F1 to F4 of each written word are set to (0, 1, 0, 1).

Further, the check is carried out in the series of the parity check code P. When this series has no data word that is judged as being erroneous by the CRC check code C and no error is detected by the parity check, the flags F1 and F2 of all the data words in that series are set to (0, 0). When the error is detected, the flags F1 and F2 are set to (1, 0). When there are more than or equal to one data word that is judged as being erroneous by the CRC check code C, the flags are left unchanged. This process will be carried out on all the data blocks.

Furthermore, for the series of the parity check code Q, the similar check as above is carried out and the flags F3 and F4 are rewritten as required. This process will be carried out on all the data blocks.

As a result, the data words having the flags F1 to F4 expressed by the following equations $$(F1, F2, F3, F4) = (1, 0, 1, 0) \quad (1)$$
$$= (1, 0, 0, 1) \quad (2)$$
$$= (0, 1, 1, 0) \quad (3)$$

have an extremely large possibility of being erroneous because they are judged as being erroneous by the both series or have some possibility of being erroneous left because they are judged as being erroneous by one series and can not be checked for error by the other series. Thus, these data words are judged as being erroneous.

On the other hand, since the other data words except the above are not judged as being erroneous by one series, while other data words in the other series are judged as being erroneous in the other series, which then are regarded as data words having no error.

More specifically, in FIG. 6, the portion (C) which is judged is being erroneous by the CRC check code C and the portions (1), (2) and (3) which are judged as being erroneous according to the above equations (1), (2) and (3) are made erroneous. While in the above example, even the portion (0) is regarded as being erroneous but in this case, this portion is not regarded as erroneous and hence the number of erroneous words is reduced.

Figures 7, 8:
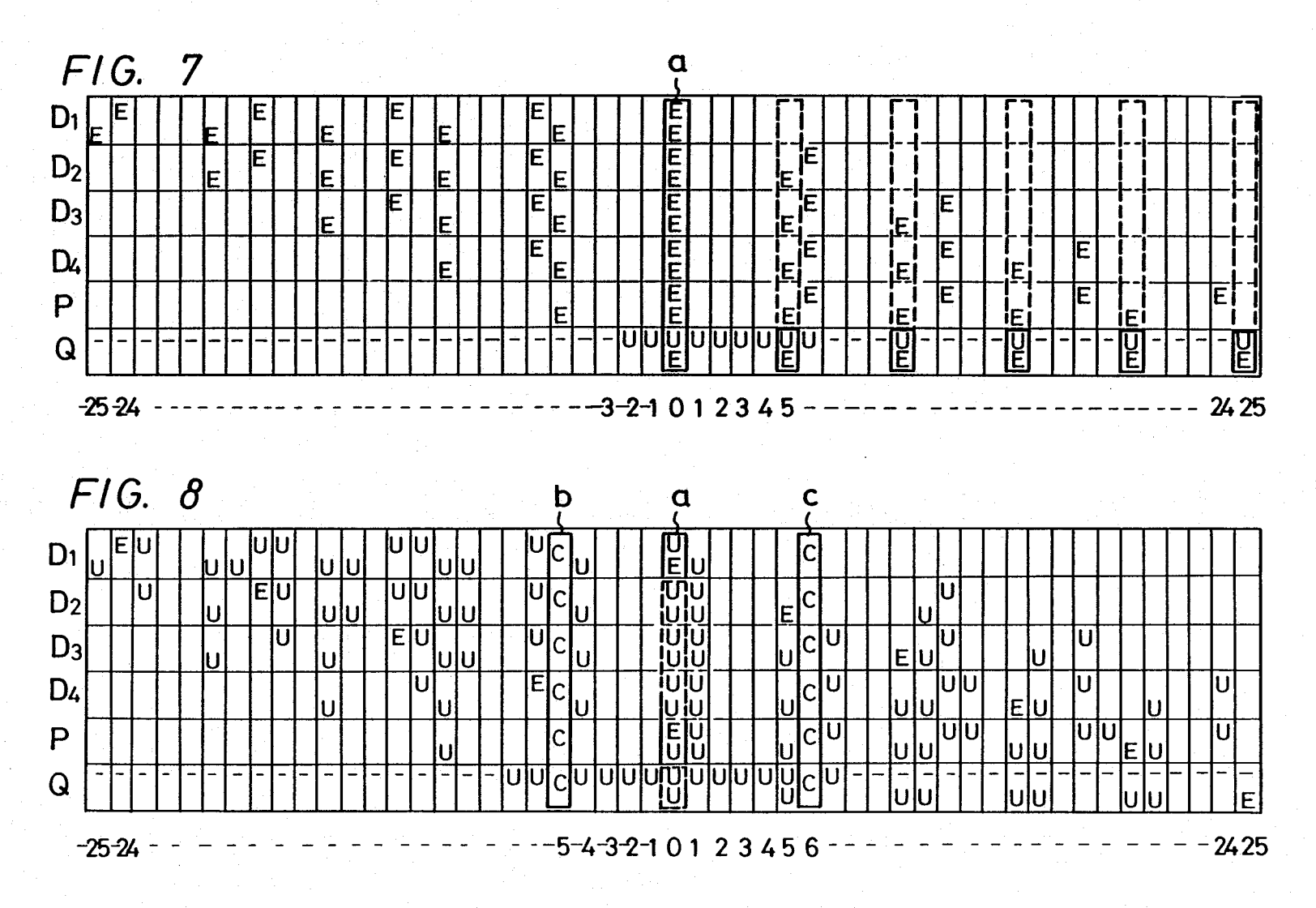

In FIG. 7, under the same condition as that of FIG. 4, only the erroneous data block a encircled by the solid line and the portion Q that is not judged by the series of the parity check code P are judged as being erroneous. Accordingly, the number of the correct data words which are judged as being erroneous can be reduced. Thus, the possibility that the tone quality is deteriorated is reduced.

Further, in FIG. 8, when there are data blocks b and c which will be judged as being erroneous by the CRC check code C together with the erroneous data a, the states of the flags F1 to F4 of each data word become as shown in the figure. The result checked by the series of the parity check code P is indicated on the upper side of each box by a letter and the result checked by the sequence of the parity check code Q is indicated on the lower side of each box by a letter. Of the reference letters E designates (1, 0), U designates (0, 1), C designates (1, 1, 1, 1) and a block designates (0, 0), In this case, the data words which are judged as being erroneous are only all the data words contained in the data blocks b and c encircled by the solid lines and detected by the CRC check code C and the data words D1 and P of the data block a.

Figures 9, 10:
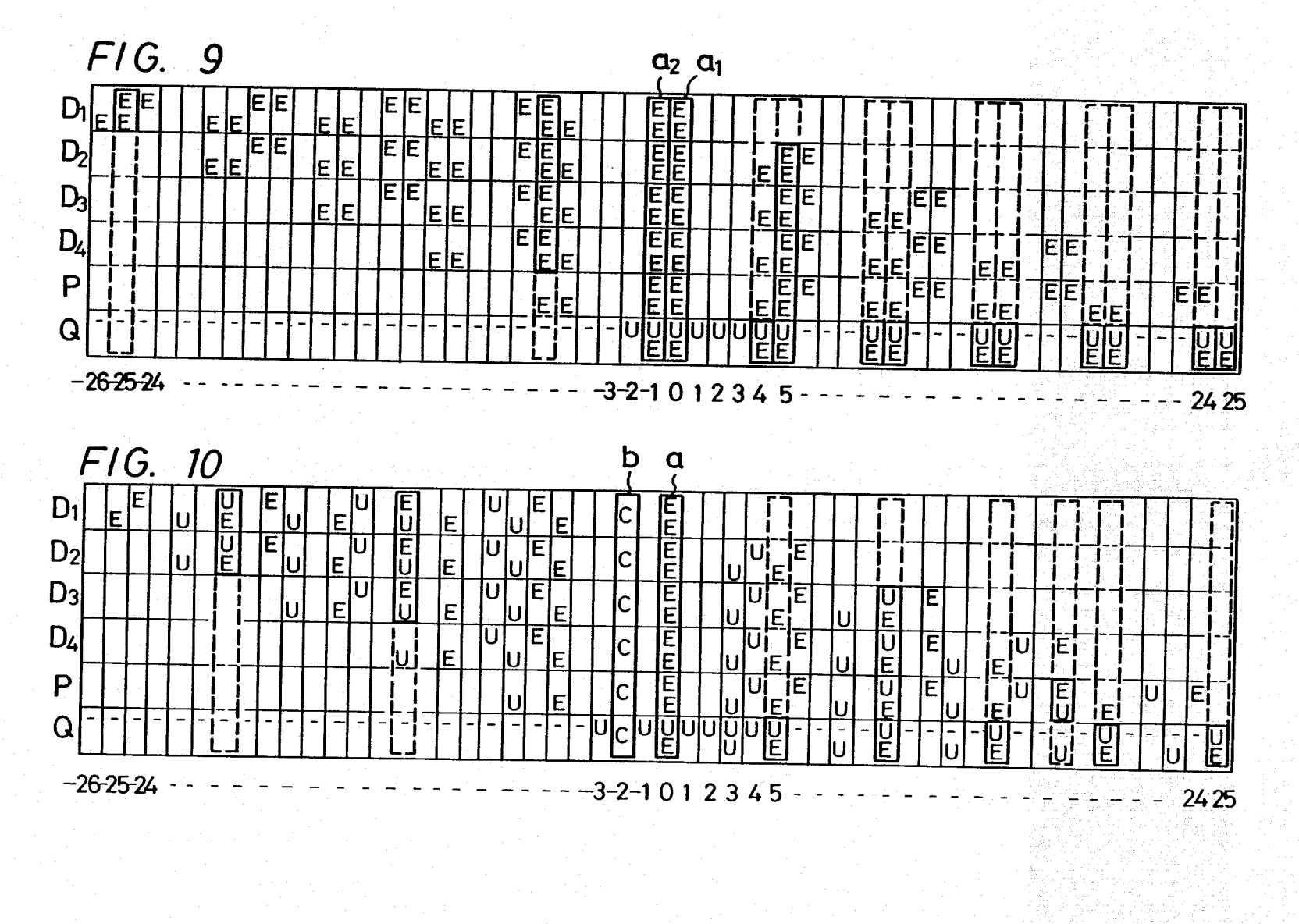

FIG. 9 shows a case in which there is no error detected by the CRC check code C and two data blocks $a_1$ and $a_2$ are successively erroneous. In this case, the data words which are judged as being erroneous are encircled by the solid lines.

FIG. 10 shows a case in which there is an erroneous data block b detected by the CRC check code C in the vicinity of the erroneous data block a. In this case, the data words which are judged as being erroneous are encircled by the solid line.

However, in this method, if in each of the both series of the parity check codes P and Q there are more than or equal to one erroneous data word by the CRC check code C, the detection of the data words becomes impossible. That is, the detection of the data words D1 to D4 and Q within the data block a in FIG. 8 becomes impossible and hence there is a fear that the error will be overlooked.

As described above, in the case of the cross-interleaving of non-recursive type in which the series of the parity check code P does not includes check word Q, if there is only one erroneous data word detected by the CRC check code C in a series of Q including an erroneous parity check code Q, the detection of the error becomes impossible and the erroneous correction is carried out by the overlooked erroneous data word. As a result, there is a fear that the erroneous correction will be propagated.

However, the data block which is not detected by the CRC check code C and which is erroneous has a very large probability that all the words in the data block are erroneous.

Therefore, after the above detection, the respective data words of the data block including even one erroneous data word are regarded as being erroneous and the flags F1 to F4 are set to (1, 1, 1, 1). That is, the data words encircled by the broken lines in FIGS. 7 to 10 are all regarded as being erroneous.

Thus, it is possible to reduce the possibility of overlooking the erroneous data words.

However, in this case, if there are many data blocks which are judged as being erroneous by the CRC check code C, there is a fear that the correct data words are judged as being erroneous by the parity check and the data word is regarded as being erroneous unnecessarily. Further, if the erroneous data block which is not detected by the CRC check code C exists near the correct data word, the correct data word is judged as being erroneous by the both series of the parity check codes P and Q so that the whole of the data block in which the data word is contained is judged as being erroneous.

Accordingly, in the above detection, the data words that are judged as being correct, namely, the portions (4), (5) and (6) in FIG. 6 are detected and only when no correct data word is unchanged in the data block, all the data words contained in that data block are judged as being erroneous.

For example, if there is even one correct data word, all the data words in that data block are regarded as being correct. Thus, as shown in FIGS. 7 to 10, the data blocks other than the data blocks a, b, c, $a_1$ and $a_2$ contain the correct data words, and if these data blocks are regarded as being correct, it is possible to specify the erroneous data blocks substantially perfectly.

In a probability standpoint, there may be a case where a partial data word in the erroneous data block will occasionally be judged as being correct so that the number of the correct data words in that data block is detected. Then, if the detected number is beyond a predetermined number, the data block is judged as being correct. Further, it is also possible that when the flags F1 to F4 as shown by (4) are (0, 0, 0, 0), the weighting is carried out therefor so as to judge the number of the correct data words.

Regarding the data words which are judged as being erroneous in the above example, the flags F1 to F4 thereof are all rewritten into (1, 1, 1, 1) and these erroneous data words are processed similarly to those that are judged as being erroneous by the CRC check code C.

We claim:

1. A method for error detection and correction, including the steps of decoding a data signal formed with data words each having a predetermined number of bits of digital signals, a plurality of said words being formed into a data block, providing a first error check code for a first series of data words within said data block, a second error check code for another series of data words, different from said first series within said data block, performing an error check procedure using said first error check code, conducting an error check procedure independent of said first error check procedure using said second error check code, and accepting data as erroneous, for a subsequent error correction procedure, when such data is identified as erroneous by one of said two error check codes.

2. The method according to claim 1, including the steps of conducting an error check procedure using said first and second error check codes for independently detecting a parity error in each of said data words, and identifying as erroneous, for a subsequent error correction procedure, data words which have a parity error detected by use of both of said error check codes and identifying as unerroneous, data words which have a parity error detected by only one of said error check codes.

3. The method according to claim 2, including the steps of conducting a CRC check of each of said data words, and marking as erroneous for a subsequent error correction procedure, all data words having a CRC error, and all data words having no CRC error but a parity error detected by use of both of said first and second error check codes, and marking as nonerroneous data words having no CRC errors and no more than one detected parity error.

4. The method according to claim 1, including the steps of providing a memory area for the storage of each data word, and storing in said memory area, for each data word, a plurality of flags produced by detection of errors by use of said first and second error codes, such flags serving to identify the result of said error detection prior to a subsequent error correction procedure.

5. A method for error detection, comprising the steps of decoding a data signal which is formed of words having a predetermined number of bits of digital signals, forming a data block of a predetermined number of said data words which are successive on a recording or transmission medium, providing one error check code for a first series within said data block and providing a plurality of other error check codes for a plurality of series which are different from said first series within said data block for a sequence of said data blocks, and designating as erroneous, prior to error correction, all of the erroneous data words which are detected by said plurality of other error check codes.

6. A method for error detection, comprising the steps of decoding a data signal which is formed of words having a predetermined number of bits of digital signals, forming a data block of a predetermined number of said data words which are successive on a recording or transmission medium providing one error check code for a first series within said data block and providing a plurality of other error check codes for a plurality of series which are different from said first series within said data block for a sequence of said data blocks, and designating only data words detected by said plurality of other error check codes as being erroneous, simultaneously.

7. A method for error detection, comprising the steps of decoding a data signal which is formed of words having a predetermined number of bits of digital signals, forming a data block of a predetermined number of said data words which are successive on a recording or transmission medium, providing one error check code for a first series within said data block and providing a plurality of other error check codes for a plurality of series which are different from said first series within said data block for a sequence of said data blocks, and designating as erroneous only a data word which is detected as erroneous by at least one or more error check codes in said plurality of other check codes and which is detected as being correct by the remaining error check codes.

8. A method for error detection, comprising the steps of decoding a data signal which is formed of words having a predetermined number of bits of digital signals, forming a data block of a predetermined number of said data words which are successive on a recording or transmission medium, providing one error check code for a first series within said data block and providing a plurality of other error check codes for a plurality of series which are different from said first series within said data block for a sequence of said data blocks, and designating as erroneous all of said data words contained in said data block which contains data words judged as being erroneous by said plurality of other check codes.

9. A method for error detection, comprising the steps of decoding a data signal which is formed of words having a predetermined number of bits of digital signals, forming a data block of a predetermined number of said data words which are successive on a recording or transmission medium, providing one error check code for a first series within said data block and providing a plurality of other error check codes for a plurality of series which are different from said first series within said data block for a sequence of said data blocks, and designating as erroneous all of the data words contained in said data block which contains a data word judged as being erroneous by said plurality of other error check codes, when there is no said data word which is detected as being correct by at least said plurality of other error check codes.

10. A method for error detection, comprising the steps of decoding a data signal having data words formed of a predetermined number of bits of digital signals, forming a data block of a predetermined number of successive ones of said data words on a recording or transmission medium, providing a first error check code for a first series within said data block and providing a second error check code for a second series which is different from said first series within said data block for a sequence of said data blocks, and designating all erroneous data words detected by said second error check code as being erroneous when an error is detected using said first error check code.

* * * * *